United States Patent
Arakawa

(10) Patent No.: US 9,391,611 B2
(45) Date of Patent: Jul. 12, 2016

(54) OPERATION DEVICE

(71) Applicant: KABUSHIKI KAISHA TOKAI RIKA DENKI SEISAKUSHO, Aichi (JP)

(72) Inventor: Shuri Arakawa, Aichi (JP)

(73) Assignee: KABUSHIKI KAISHA TOKAI RIKA DENKI SEISAKUSHO, Aichi (JP)

( * ) Notice: Subject to any disclaimer, the term of this patent is extended or adjusted under 35 U.S.C. 154(b) by 0 days.

(21) Appl. No.: 14/585,262

(22) Filed: Dec. 30, 2014

(65) Prior Publication Data

US 2015/0200665 A1 Jul. 16, 2015

(30) Foreign Application Priority Data

Jan. 15, 2014 (JP) ................................. 2014-005002

(51) Int. Cl.
*H03K 17/96* (2006.01)

(52) U.S. Cl.
CPC ............... *H03K 17/9622* (2013.01); *H03K 2217/960755* (2013.01)

(58) Field of Classification Search
CPC ............... H03K 2217/960755; H03K 17/9622
USPC ........... 200/5 A, 600, 511–512, 5 R; 345/173
See application file for complete search history.

(56) References Cited

U.S. PATENT DOCUMENTS

| 6,926,106 | B2 * | 8/2005 | Richey, II | A61G 5/045 180/65.1 |
| 8,115,744 | B2 * | 2/2012 | Kong | G06F 3/041 345/173 |
| 8,237,069 | B2 * | 8/2012 | GaleWyrick | H01H 13/7073 200/5 B |
| 8,723,067 | B2 * | 5/2014 | Yeh | G06F 3/044 200/600 |
| 2012/0218029 | A1 | 8/2012 | Furuta et al. | |

FOREIGN PATENT DOCUMENTS

JP 2012-178233 A 9/2012

* cited by examiner

*Primary Examiner* — Edwin A. Leon
(74) *Attorney, Agent, or Firm* — Roberts Mlotkowski Safran & Cole, PC

(57) ABSTRACT

An operation device includes a detecting portion that is configured to detect an operation by a detected object and includes a plurality of operational areas each having a different assigned function executable on a controlled device as an operational object; and a dividing portion to guide the operation of the detected object and to separate the plurality of operational areas along boundaries between the plurality of operational areas of the detecting portion. The dividing portion includes an operable area that allows an operation across adjacent ones of the operational areas by the detected object.

10 Claims, 6 Drawing Sheets

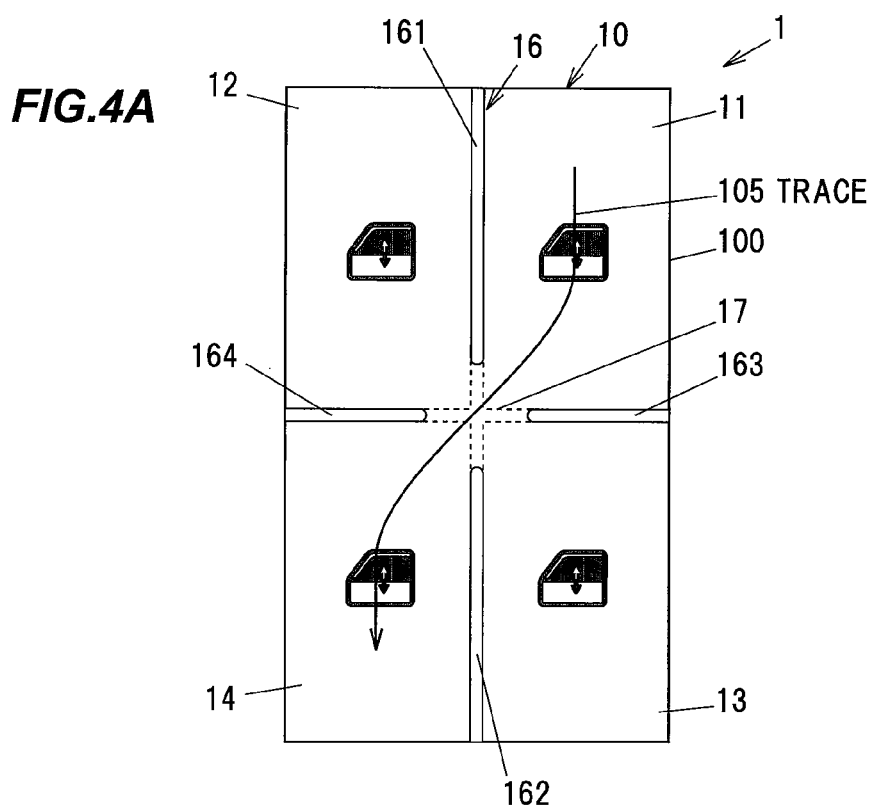
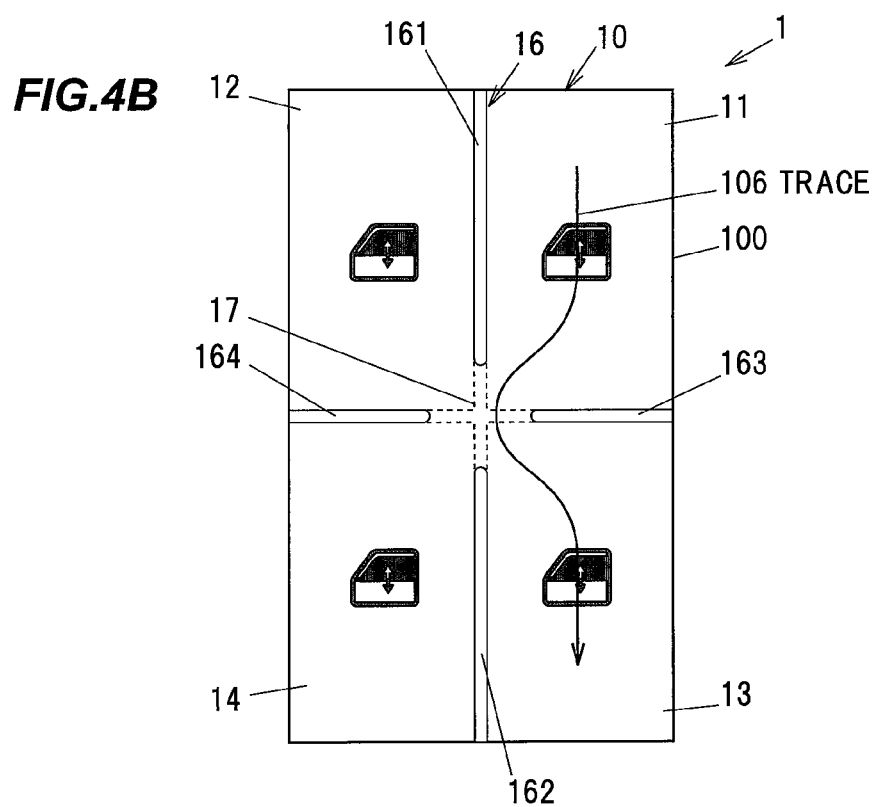

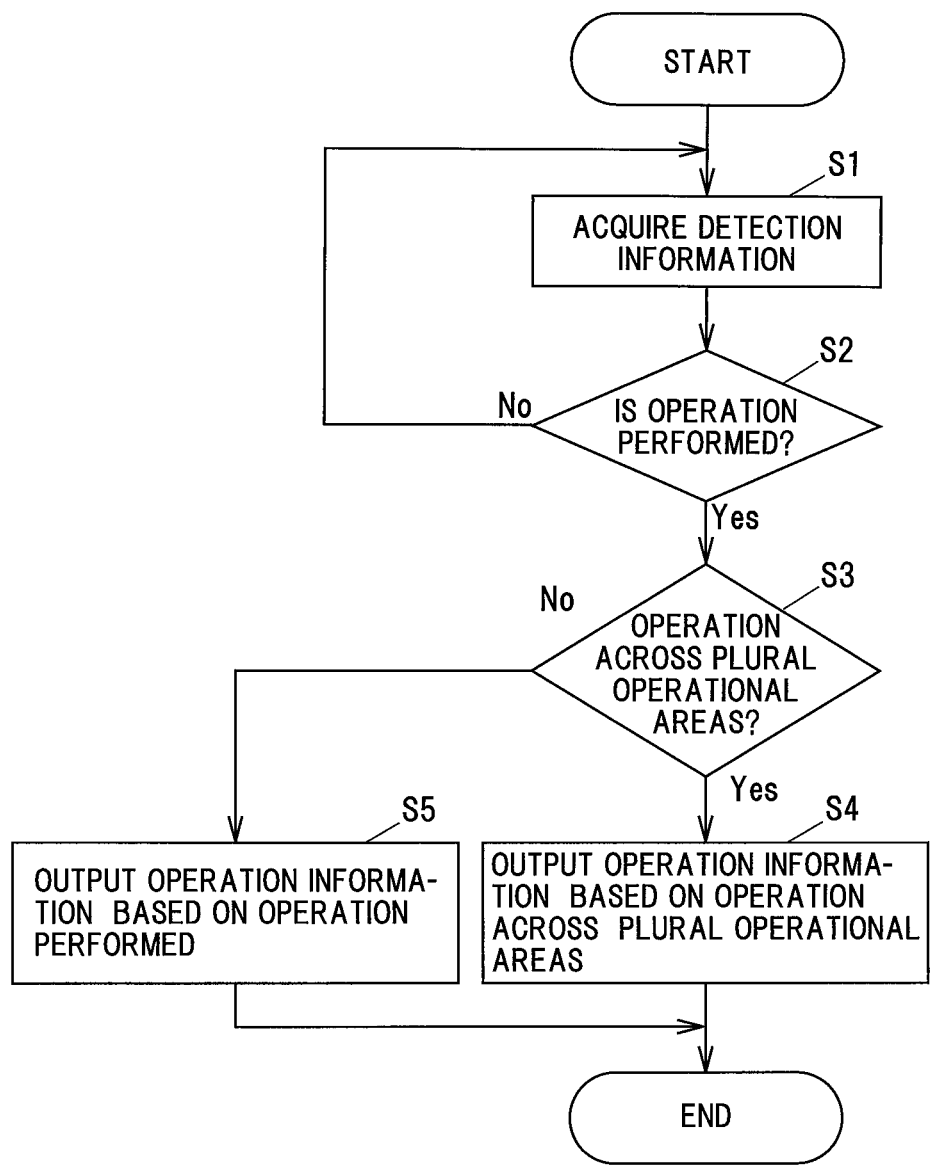

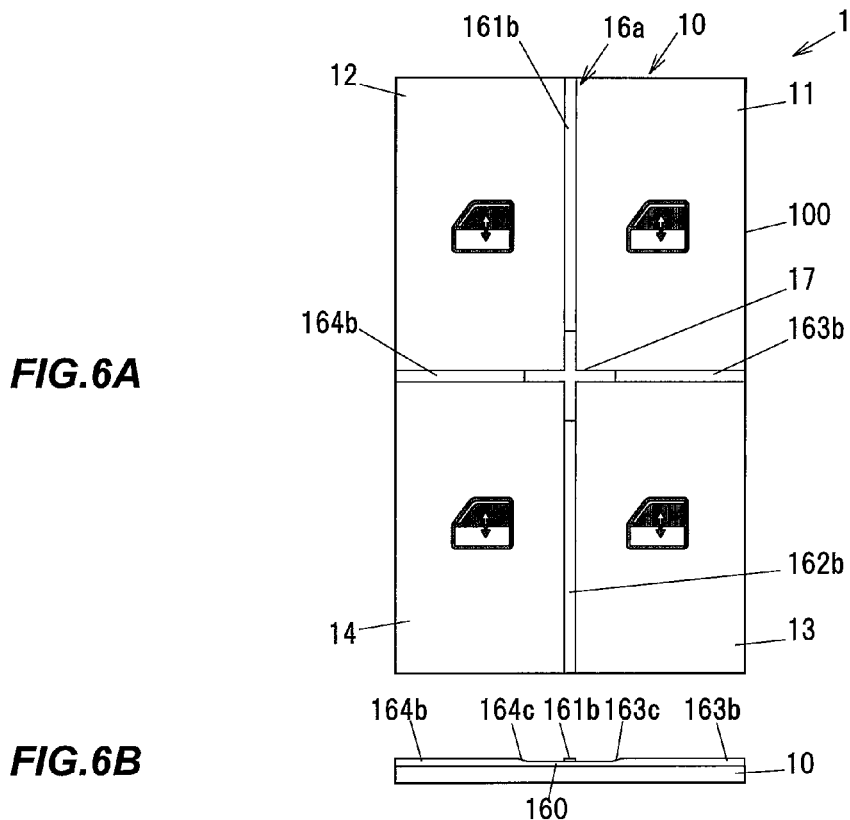
*FIG.6A*
*FIG.6B*
*FIG.6C*
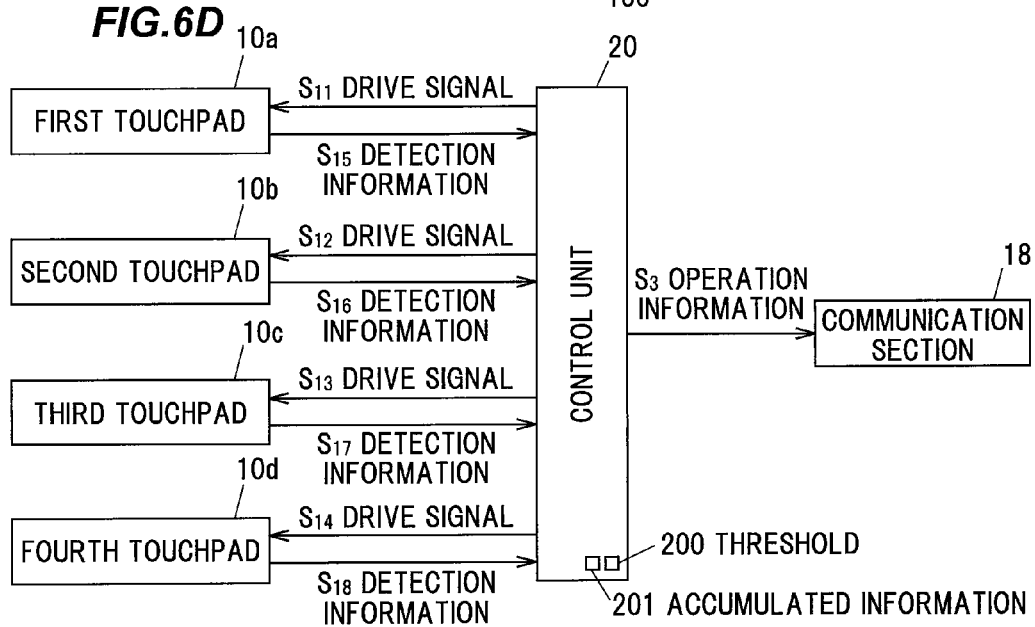
*FIG.6D*

OPERATION DEVICE

The present application is based on Japanese patent application No. 2014-005002 filed on Jan. 15, 2014, the entire contents of which are incorporated herein by reference.

BACKGROUND OF THE INVENTION

1. Field of the Invention

The invention relates to an operation device for controlling an electronic device such as a window actuator.

2. Description of the Related Art

A touch switch is known which detects contact of a detection-target (or detected object) conductor with a conductive member and contact points (see, e.g., JP-A-2012-178233).

The touch switch is provided with a partitioning raised portion which protrudes from an operation surface and divides the operation surface of the conductive member to be touched by the detection-target conductor into plural sensitive surfaces.

In the touch switch, the plural sensitive surfaces are defined by the partitioning raised portion protruding from the operation surface and this allows an operator to perform an intended operation not visually but haptically.

SUMMARY OF THE INVENTION

The operability of the touch switch when performing, e.g., an operation across the adjacent sensitive surfaces is not good since the operation across the adjacent sensitive surfaces is disturbed by the partitioning raised portion.

It is an object of the invention to provide an operation device that can improve the operation across the adjacent sensitive surfaces.

(1) According to one embodiment of the invention, an operation device comprises:

a detecting portion that is configured to detect an operation by a detected object and comprises a plurality of operational areas each having a different assigned function executable on a controlled device as an operational object; and a dividing portion to guide the operation of the detected object and to separate the plurality of operational areas along boundaries between the plurality of operational areas of the detecting portion, wherein the dividing portion comprises an operable area that allows an operation across adjacent ones of the operational areas by the detected object.

(2) According to another embodiment of the invention, an operation device comprises:

a detecting portion that is configured to detect an operation by a detected object and comprises a plurality of operational areas each having a different assigned function executable on a controlled device as an operational object;

a plurality of linear dividing portions to guide the operation of the detected object and to separate the plurality of operational areas along boundaries between the plurality of operational areas of the detecting portion; and a non-dividing portion between adjacent ones of the dividing portions, wherein the non-dividing portion comprises a texture different from the dividing portions so as to allow an operation across adjacent ones of the operational areas by the detected object.

EFFECTS OF THE INVENTION

According to one embodiment of the invention, an operation device can be provided that can improve the operation across the adjacent sensitive surfaces.

BRIEF DESCRIPTION OF THE DRAWINGS

Next, the present invention will be explained in more detail in conjunction with appended drawings, wherein:

FIG. 4A is a schematic view showing an operation performed across first and fourth operational areas on the operation device in the first embodiment;

FIG. 4B is a schematic view showing an operation performed across first and third operational areas;

FIG. 5 is a flowchart showing an operation of the operation device in the first embodiment;

FIG. 6A is a top view showing an operation device in a second embodiment;

FIG. 6B is a side view as viewed from a side surface in a lateral direction of an operation surface;

FIG. 6C is a side view as viewed from a side surface in a longitudinal direction of the operation surface; and FIG. 6D is a block diagram illustrating an operation device in a third embodiment.

DETAILED DESCRIPTION OF THE PREFERRED EMBODIMENTS

Summary of the Embodiments

Operation devices of the embodiments are generally composed of a detecting portion which is configured to detect an operation by a detection target (or detected object) and has plural operational areas each having a different assigned function executable on a controlled device as an operational object, and a dividing portion which is provided to guide an operation of the detection target and to separate the plural operational areas along boundaries between the plural operational areas of the detecting portion so that an operable area (or non-dividing portion) allowing for an operation across adjacent operational areas is provided thereon.

Since the operation devices guide an operation by the dividing portion and have an operable area allowing for an operation across adjacent operational areas, an operator can easily perform an operation across adjacent operational areas as compared to a device with operational areas surrounded by a divider and the operability is improved.

First Embodiment

Configuration of Operation Device 1

Figure 1A:
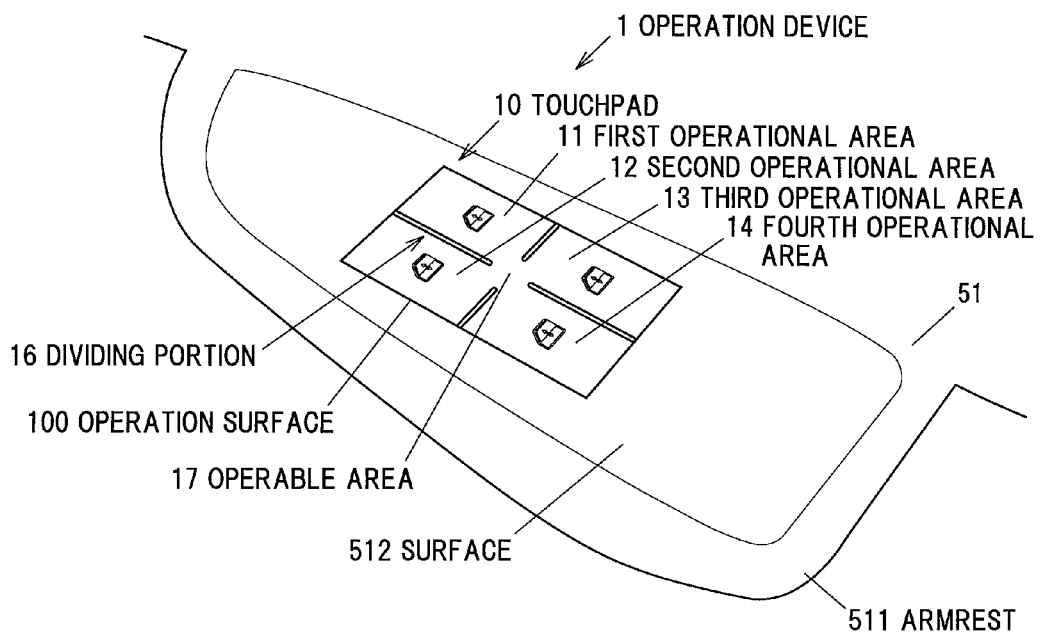
FIG. 1A is a schematic view showing an operation device in a first embodiment arranged on the inner side of a front right door of a vehicle.
Figure 1B:
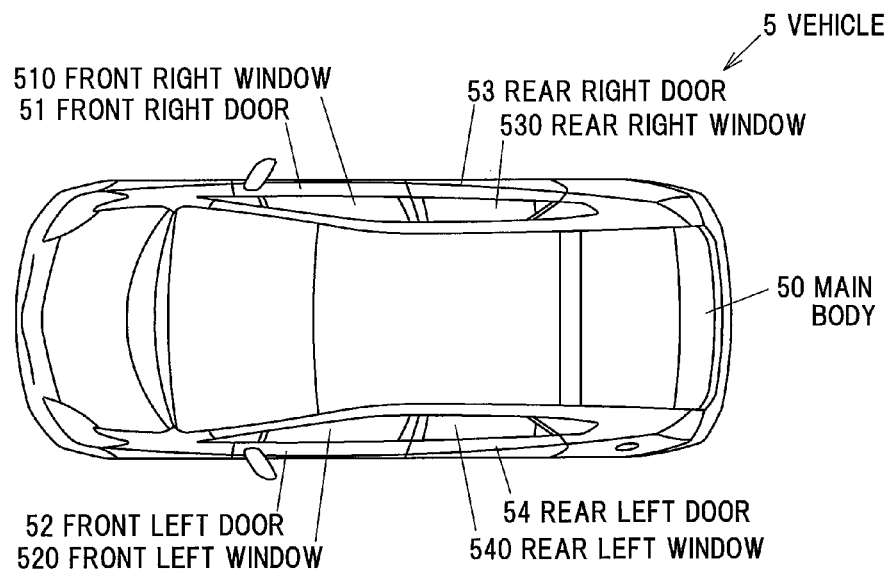
FIG. 1B is a top view showing the vehicle.
Figure 2A:
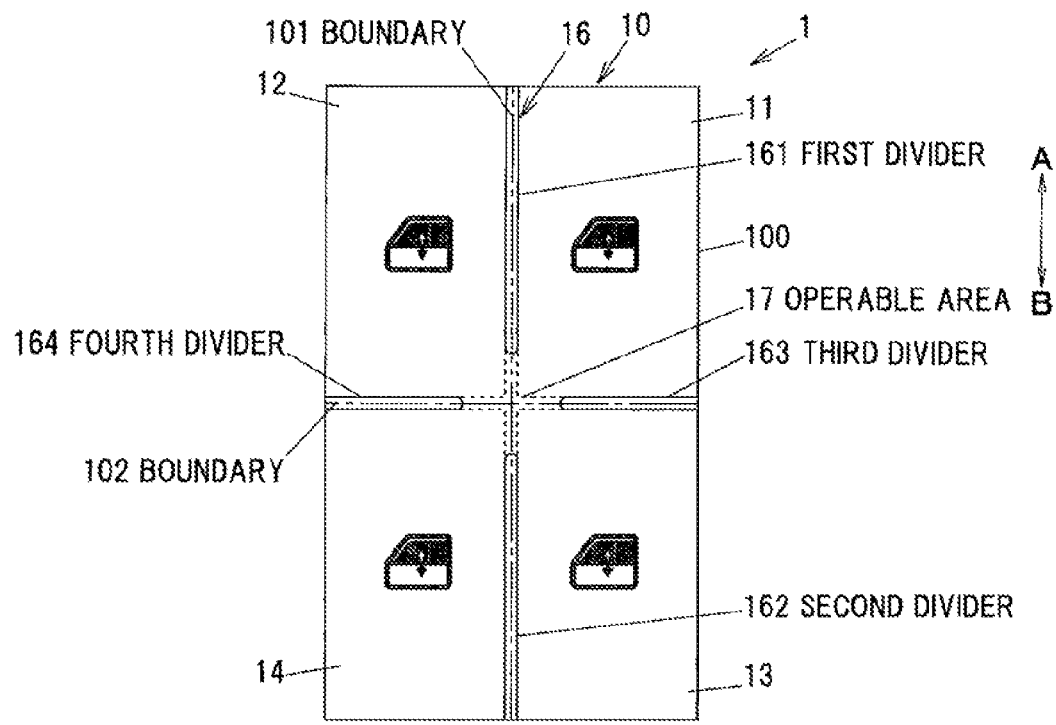
FIG. 2A is a top view showing the operation device in the first embodiment.
Figure 2B:
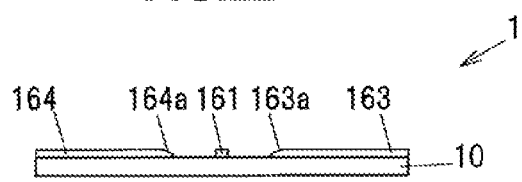
FIG. 2B is a side view as viewed from a side surface in a lateral direction of an operation surface.
Figure 2C:
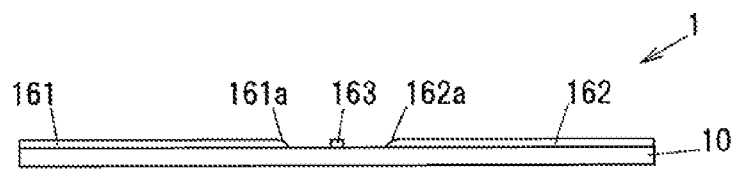
FIG. 2C is a side view as viewed from a side surface in a longitudinal direction of the operation surface.
Figure 3A:
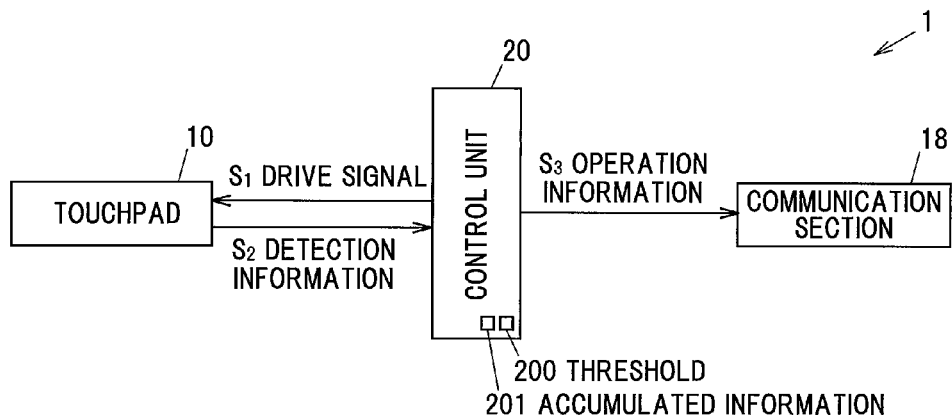
FIG. 3A is a block diagram illustrating the operation device in the first embodiment.
Figure 3B:
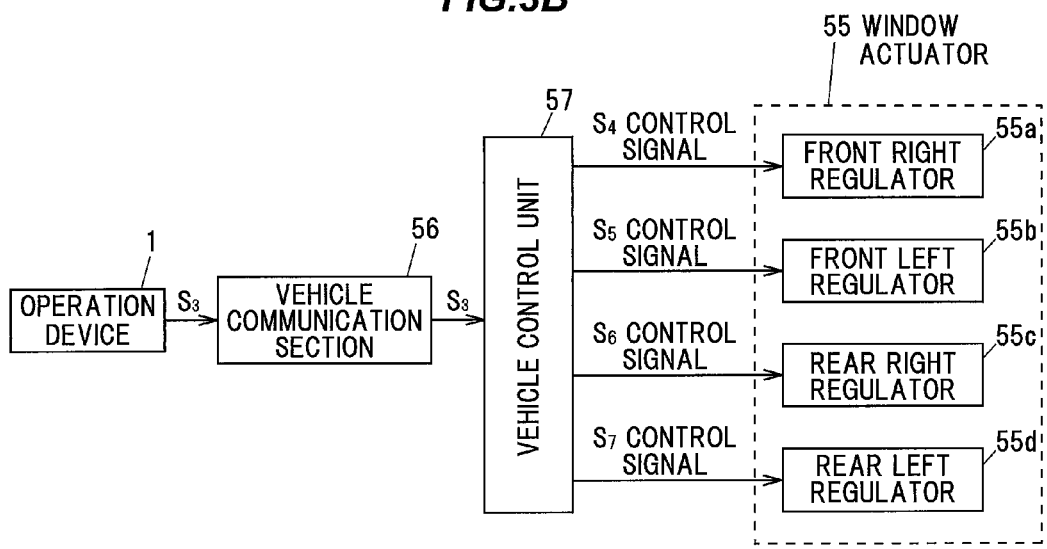
FIG. 3B is a block diagram illustrating the vehicle electromagnetically connected the operation device.

FIG. 1A is a schematic view showing an operation device in a first embodiment arranged on the inner side of a front right door of a vehicle and FIG. 1B is a top view showing the vehicle. FIG. 2A is a top view showing the operation device in the first embodiment, FIG. 2B is a side view as viewed from a side surface in a lateral direction of an operation surface and FIG. 2C is a side view as viewed from a side surface in a longitudinal direction of the operation surface. FIG. 3A is a block diagram illustrating the operation device in the first embodiment and FIG. 3B is a block diagram illustrating the vehicle electromagnetically connected the operation device. In each drawing of the embodiments described below, a scale ratio may be different from an actual ratio. In addition, in FIGS. 3A, 3B and 6D, flows of main signals and information are indicated by arrows.

As an example, the operation device 1 is generally composed of four operational areas which allow to give instructions to open and close windows of a vehicle 5, as shown in FIG. 1A. In other words, the operation device 1 is capable of operating a window actuator (described later) as a controlled device. The controlled device operable by the operation device 1 is not limited to window actuators and other electronic devices mounted on a vehicle and the operation device 1 is also applicable to air conditioners, navigation systems, music playback devices and video playback devices, etc.

The windows here are a front right window 510 of a front right door 51 on the right side of a main body 50 of the vehicle 5, a front left window 520 of a front left door 52 on the left side, a rear right window 530 of a rear right door 53 and a rear left window 540 of a rear left door 54, as shown in FIG. 1A. The windows are opened and closed by the window actuator.

Right and left described hereinafter are defined such that the upper side of the main body 50 in FIG. 1B is right and the lower side is left. In other words, the right side of an operator sitting on the driver's seat of the vehicle 5 and facing the front is defined as right and the left side is defined as left.

As shown in FIG. 1A, the operation device 1 is arranged on a surface 512 of a armrest 511 located on the inner side of the front right door 51. The operation device 1 is configured to detect an operating finger of an operator as a detection target.

The operation device 1 is generally composed of a touchpad 10 as a detecting portion and a dividing portion 16. The touchpad 10 is configured to detect an operation by an operating finger and has first to fourth operational areas 11 to 14 each having a different assigned function executable on a controlled device as an operational object. The dividing portion 16 is provided to guide an operation of the operating finger and to separate the first to fourth operational areas 11 to 14 along boundaries 101 and 102 between the first to fourth operational areas 11 to 14 of the touchpad 10 so that an operable area 17 allowing for an operation across adjacent operational areas is provided thereon.

The different functions executable on a controlled device are, e.g., functions of opening/closing the front right window 510, the front left window 520, the rear right window 530 and the rear left window 540 when the controlled device is a window actuator.

As shown in FIG. 3A, the operation device 1 is also provided with a communication section 18 and a control unit 20. As shown in FIG. 3B, the communication section 18 is electromagnetically connected to a vehicle communication section 56. Here, electromagnetic connection is connection using at least one of a conductive material, light as a kind of electromagnetic wave and radio wave as a kind of electromagnetic wave.

Configuration of the Touchpad 10

The touchpad 10 is a touch sensor which detects a position on an operation surface 100 touched by, e.g., a portion of the body of an operator (e.g., a finger) or a special pen. The operator can operate a connected electronic device by, e.g., performing an operation on the operation surface 100. As the touchpad 10, it is possible to use, e.g., a well-known resistive, SAW (Surface Acoustic Wave) or capacitive touchpad, etc.

The touchpad 10 in the first embodiment is, e.g., a capacitive touch panel detecting variation in current which is caused by an approach of a finger to the operation surface 100 and is inversely proportional to a distance between sensor wires and the finger. The sensor wires are provided under the operation surface 100 so as to intersect with each other even though it is not illustrated.

As shown in FIG. 3A, the touchpad 10 is configure to periodically read out capacitance based on a drive signal $S_1$ supplied from the control unit 20. The touchpad 10 produces detection information $S_2$ including the read-out capacitance and outputs the detection information $S_2$ to the control unit 20.

As shown in FIG. 1A, the operation surface 100 of the touchpad 10 is divided into the first to fourth operational areas 11 to 14. The dividing portion 16 is provided on the boundaries 101 and 102 between the first to fourth operational areas 11 to 14. The number of operational areas is not limited to four and is arbitrarily selected according to the intended use.

The first operational area 11 and the second operational area 12 are arranged on the front side of the vehicle 5, as shown in FIG. 1A. Then, the third operational area 13 and the fourth operational area 14 are arranged on the rear side of the vehicle 5, as shown in FIG. 1A.

The first operational area 11 and the third operational area 13 are arranged on the right side. Then, the second operational area 12 and the fourth operational area 14 are arranged on the left side. In other words, the first to fourth operational areas 11 to 14 are arranged based of the positions of the front right window 510, the front left window 520, the rear right window 530 and the rear left window 540 with respect to an operator sitting on the driver's seat.

A function of opening/closing the front right window 510 based on a swipe operation performed in the directions of the arrows A and B shown in FIG. 2A is assigned to the first operational area 11. The swipe operation in the direction of the arrow A is an operation to close the front right window 510. Meanwhile, the swipe operation in the direction of the arrow B is an operation to open the front right window 510. When a trace of the swipe operation exceeds a predetermined length, for example, the front right window 510 is fully opened or fully closed.

Likewise, a function of opening/closing the front left window 520 based on a swipe operation performed in the directions of the arrows A and B is assigned to the second operational area 12. A function of opening/closing the rear right window 530 based on a swipe operation performed in the directions of the arrows A and B is assigned to the third operational area 13. A function of opening/closing the rear left window 540 based on a swipe operation performed in the directions of the arrows A and B is assigned to the fourth operational area 14.

As such, the first to fourth operational areas 11 to 14 in the first embodiment are formed by dividing the operation surface 100 of the touchpad 10 by the dividing portion 16 and are differentiated by the control unit 20. This differentiation is based on, e.g., coordinates on a coordinate system which is set on the operation surface 100.

When an operator performs a touch operation on the front side of an operational area, window-closing movement continues for a period of time corresponding to duration of contact. Meanwhile, when the operator performs a touch operation on the rear side of an operational area, window-opening movement continues for a period of time corresponding to duration of contact.

Configuration of the Dividing Portion 16

The dividing portion 16 is formed of, e.g., an insulating material. The dividing portion 16 may be or may not be in contact with the operation surface 100. As a modification, the dividing portion 16 may be formed by, e.g., printing.

The dividing portion 16 is formed as a raised portion protruding on the first to fourth operational areas 11 to 14. Meanwhile, the operable area 17 is formed as a recess on the dividing portion 16 between a first divider 161 and a second divider 162 as well as between a third divider 163 and a fourth divider 164, as indicated by a dotted line in FIG. 2A.

In detail, the dividing portion 16 is arranged on the operation surface 100 of the touchpad 10 along the boundaries 101 and 102 between the first to fourth operational areas 11 to 14. The dividing portion 16 is composed of the first to fourth dividers 161 to 164, as shown in FIGS. 2A to 2C.

The operable area 17 is formed at a position where the boundary 101 intersects with the boundary 102. In other words, the dividing portion 16 is configured that a raised portion is not formed in the operable area 17 in which the boundary 101 in a longitudinal direction of the operation surface 100 intersects with the boundary 102 in a lateral direction.

The operable area 17 has, e.g., a size allowing an operator to move a finger from one operational area to another operational area.

The first divider 161 is arranged on the boundary 101 between the first operational area 11 and the second operational area 12. The second divider 162 is arranged on the boundary 101 between the third operational area 13 and the fourth operational area 14. The third divider 163 is arranged on the boundary 102 between the first operational area 11 and the third operational area 13. The fourth divider 164 is arranged on the boundary 102 between the second operational area 12 and the fourth operational area 14.

On the dividing portion 16, slopes at which a height of the dividing portion 16 gradually decreases are formed at end portions on the operable area 17 side.

In more detail, the first divider 161 has a tapering slope 161a at an end portion on the operable area 17 side, as shown in FIG. 2C. The second divider 162 has a tapering slope 162a at an end portion on the operable area 17 side. Then, the third divider 163 has a tapering slope 163a at an end portion on the operable area 17 side, as shown in FIG. 2B. Furthermore, the fourth divider 164 has a tapering slope 164a at an end portion on the operable area 17 side.

Configuration of the Control Unit 20

FIG. 4A is a schematic view showing an operation performed across the first and fourth operational areas on the operation device in the first embodiment and FIG. 4B is a schematic view showing an operation performed across the first and third operational areas.

The control unit 20 is, e.g., a microcomputer composed of a CPU (Central Processing Unit) performing calculation and processing, etc., of the acquired data according to a stored program, a (Random Access Memory) and a ROM (Read Only Memory) which are semiconductor memories. The ROM stores e.g. a program for operation of the control unit 20. The RAM is used as, e.g., a storage area for temporarily storing calculation results, etc. In addition, the control unit 20 has a threshold 200 and an accumulated information 201, as shown in FIG. 3A.

The control unit 20 detects contact of an operating finger with the operation surface 100 by comparing the threshold 200 with capacitance included in the detection information $S_2$ periodically acquired from the touchpad 10 and calculates coordinates at which the operating finger is detected.

Also, the control unit 20 stores together with the detection time the coordinates of the detection point as the accumulated information 201 when the operating finger is detected.

The control unit 20 produces operation information $S_3$ based on an operation across plural operational areas.

In detail, when an operator performs a swipe operation along a trace 105 passing through the first operational area 11, the operable area 17 and the fourth operational area 14 as shown in FIG. 4A, the control unit 20 calculates coordinates of the detected operating finger based on the periodically acquired detection information $S_2$ and accumulates the coordinates as the accumulated information 201.

The control unit 20 determines an operation based on the accumulated information 201. Based on the determination, the control unit 20 produces operation information $S_3$ for fully opening the front right window 510 according to the operation performed on the first operational area 11 and for fully opening the rear left window 540 according to the operation performed on the fourth operational area 14, and outputs the operation information $S_3$ to the vehicle communication section 56 via the communication section 18.

Likewise, when an operator performs a swipe operation along a trace 106 passing through the first operational area 11, the operable area 17 and the third operational area 13 as shown in FIG. 4B, the control unit 20 calculates coordinates of the detected operating finger based on the periodically acquired detection information $S_2$ and accumulates the coordinates as the accumulated information 201.

The control unit 20 determines an operation based on the accumulated information 201. Based on the determination, the control unit 20 produces operation information $S_3$ for fully opening the front right window 510 according to the operation performed on the first operational area 11 and for fully opening the rear right window 530 according to the operation performed on the third operational area 13, and outputs the operation information $S_3$ to the vehicle communication section 56 via the communication section 18.

Configuration of the Vehicle 5

The vehicle 5 is provided with, e.g., a window actuator 55, the vehicle communication section 56 and a vehicle control unit 57, as shown in FIG. 3B. The window actuator 55 is generally composed of, e.g., a front right regulator 55a, a front left regulator 55b, a rear right regulator 55c and a rear left regulator 55d.

The front right regulator 55a is actuated to open/close the front right window 510 based on a control signal $S_{44}$ acquired from the vehicle control unit 57.

The front left regulator 55b is actuated to open/close the front left window 520 based on a control signal $S_5$ acquired from the vehicle control unit 57.

The rear right regulator 55c is actuated to open/close the rear right window 530 based on a control signal $S_6$ acquired from the vehicle control unit 57.

The rear left regulator 55d is actuated to open/close the rear left window 540 based on a control signal $S_7$ acquired from the vehicle control unit 57.

The vehicle communication section 56 communicates with the communication section 18 of the operation device 1.

The vehicle control unit 57 is a microcomputer composed of a CPU, a RAM and a ROM, etc. Based on the operation information $S_3$ acquired through the vehicle communication section 56, the vehicle control unit 57 generates and outputs the control signals $S_4$ to $S_7$ for controlling the front right regulator 55a to the rear left regulator 55d.

An operation of the operation device 1 in the first embodiment according to an operation performed across plural operational areas will be described below in accordance with the flowchart of FIG. 5.

When the vehicle 5 is powered on, the control unit 20 of the operation device 1 firstly generates and outputs the drive signal $S_1$ to the touchpad 10. The control unit 20 also periodically acquires the detection information 52 from the touchpad 10 (S1).

The control unit 20 compares the threshold 200 with the capacitance included in the acquired detection information $S_2$ and determines whether or not an operation is performed. When the operation is detected, the control unit 20 calculates coordinates thereof which are then accumulated as the accumulated information 201. As an example, the detected operation here is a swipe operation performed along the trace 105 shown in FIG. 4A.

When it is determined based on the accumulated information 201 that the operation is detected (S2: Yes), the control unit 20 determines whether or not the operation is performed across plural operational areas. When it is determined that the operation is performed across plural operational areas (S3: Yes), the control unit 20 produces the operation information $S_3$ based on the determined operation across plural operational areas and outputs the operation information $S_3$ to the vehicle communication section 56 via the communication section 18 (S4).

The vehicle control unit 57 generates the control signal $S_4$ for fully opening the front right window 510 and the control signal $S_7$ for fully opening the rear left window 540 based on the operation information $S_3$ acquired via the vehicle communication section 56, and outputs the control signals $S_4$ and $S_7$ to the corresponding regulators. The front right regulator 55a is actuated to fully open the front right window 510 based on the acquired control signal $S_4$. The rear left regulator 55d is actuated to fully open the rear left window 540 based on the acquired control signal $S_7$.

Here, when any operation is not detected in Step 2 (S2: No), the control unit 20 returns the process to Step 1.

When it is determined in Step 3 that the detected operation is not across plural operational areas (S3: No), the control unit 20 determines the performed operation based on the threshold 200, produces the operation information $S_3$ based on the determined, performed operation and outputs the operation information $S_3$ to the vehicle communication section 56 via the communication section 18 (S5). The vehicle control unit 57 generates a control signal based on the operation information $S_3$ acquired via the vehicle communication section 56 and outputs the control signal to a corresponding regulator.

Effects of the First Embodiment

Since the operation device 1 of the first embodiment guides an operation by the dividing portion 16 and has the operable area 17 allowing for an operation across adjacent operational areas, an operator can easily perform an operation across adjacent operational areas as compared to a device with operational areas surrounded by a divider and operability is improved.

Since the operation device 1 has the operable area 17 formed in a region in which the boundary 101 intersects with the boundary 102, it is easier to perform an operation across adjacent operational areas than the case where the operable area is formed at another position.

The dividing portion 16 of the operation device 1 has the slopes 161a to 164a on the first to fourth dividers 161 to 164, which allows an operator to perform an operation across adjacent operational areas smoother than the case of not forming slopes.

Second Embodiment

The second embodiment is different from the other embodiments in that a portion of the dividing portion 16 is formed in the operable area 17.

FIG. 6A is a top view showing an operation device in a second embodiment, FIG. 6B is a side view as viewed from a side surface in a lateral direction of an operation surface and FIG. 6C is a side view as viewed from a side surface in a longitudinal direction of the operation surface. In the second embodiment, portions having the same functions and configurations as the first embodiment are denoted by the same reference numerals as the first embodiment and the explanation thereof will be omitted.

The operation device 1 in the second embodiment has a dividing portion 16a, as shown in FIGS. 6A to 6C. The dividing portion 16a has first to fourth dividers 161b to 164b.

The first divider 161b is connected to the second divider 162b. In addition, the third divider 163b is connected to the fourth divider 164b. The connected portion is a thin portion 160 shown in FIGS. 6B and 6C. Thus, the first to fourth dividers 161b to 164b are connected through the thin portion 160.

A slope 161c is formed at a boundary between the first divider 161b and the thin portion 160. A slope 162c is formed at a boundary between the second divider 162b and the thin portion 160. A slope 163c is formed at a boundary between the third divider 163b and the thin portion 160. A slope 164c is formed at a boundary between the fourth divider 164b and the thin portion 160.

The height from the operation surface 100 is lower at the thin portion 160 than at other portions, hence, thin. The thin portion 160 has a height which does not inhibit movement of the operating finger.

Effects of the Second Embodiment

In the operation device 1 of the second embodiment, the thin portion 160 is formed in the operable area 17 and this allows an operator to easily recognize that an operation extends to another operational area beyond the operable area 17, as compared to the dividing portion without thin portion.

Third Embodiment

The third embodiment is different from the other embodiments in that plural touchpads are used to form plural operational areas.

FIG. 6D is a block diagram illustrating an operation device in the third embodiment.

In the operation device 1 of the third embodiment, first to fourth touchpads 10a to 10d are used to form plural operational areas, as shown in FIG. 6D. That is, the first to fourth touchpads 10a to 10d are arranged so as to correspond to, e.g., the first to fourth operational areas 11 to 14 in the first embodiment.

Therefore, the first divider 161 is arranged along the boundary 101 between the first touchpad 10a and the second touchpad 10b. The second divider 162 is arranged along the boundary 101 between the third touchpad 10c and the fourth touchpad 10d. The third divider 163 is arranged along the boundary 102 between the first touchpad 10a and the third touchpad 10c. The fourth divider 164 is arranged along the boundary 102 between the second touchpad 10b and the fourth touchpad 10d. In this operation device 1, the operable area 17 is formed on the dividing portion 16.

The control unit 20 generates drive signals $S_{11}$ to $S_{14}$ for driving the first to fourth touchpads 10a to 10d and outputs the drive signals $S_{11}$ to $S_{14}$ to the corresponding touchpads.

Then, the control unit 20 periodically acquires detection information $S_{15}$ to $S_{18}$ from the first to fourth touchpads 10a to 10d and compares the information $S_{15}$ to $S_{18}$ with the threshold 200.

The control unit 20 generates the operation information $S_3$ based on the acquired detection information $S_{15}$ to $S_{18}$ and outputs the operation information $S_3$ to the vehicle communication section 56 via the communication section 18.

Effects of the Third Embodiment

In the operation device 1 of the third embodiment, plural touchpads are used to form plural operational areas. Therefore, as compared to the case where one touchpad is divided into plural areas, it is easy to determine to which operational area the coordinates of the detected operating finger belongs.

As a modification, the plural operational areas may be aligned in one direction. In case that the plural operational areas are aligned in one direction, a dividing portion is provided on a boundary between one operational area and another operational area adjacent thereto. In this dividing portion, the operable area 17 is provided, e.g., at the center. Therefore, in the operation device 1 of the modification, it is possible to perform an operation in one operational area and also to perform an operation across plural operational areas by moving an operating finger through the operable area 17.

As another modification, the dividing portion 16 may be a groove formed on the operation surface 100. In such a case, as an example, the groove is not formed in the operable area 17.

Although the operational area described above has a rectangular shape, it is not limited thereto. The operational area may have a circular shape or an oval shape, etc., as still another modification. Alternatively, each of the operational area has a different shape.

The operation device 1 in at least one of the embodiments can improve the operability.

Although some embodiments and modifications of the invention have been described above, the embodiments and modifications are merely an example and the invention according to claims is not to be limited thereto. These new embodiments and modifications may be implemented in various other forms, and various omissions, substitutions and changes, etc., can be made without departing from the gist of the invention. In addition, all combinations of the features described in the embodiments and modifications are not necessary to solve the problem of the invention. Further, these embodiments and modifications are included within the scope and gist of the invention and also within the invention described in the claims and the equivalency thereof.

What is claimed is:

1. An operation device, comprising:
   a detecting portion that is configured to detect an operation by a detected object and comprises a plurality of operational areas each having a different assigned function executable on a controlled device as an operational object; and
   a dividing portion to guide the operation of the detected object and to separate the plurality of operational areas along boundaries between the plurality of operational areas of the detecting portion,
   wherein the dividing portion comprises an operable area that allows an operation across adjacent ones of the operational areas by the detected object,
   wherein the dividing portion further comprises a raised portion protruding from the plurality of operational areas, and
   wherein the operable area comprises a region lower than the raised portion.

2. The operation device according to claim 1,
   wherein the detecting portion comprises a plurality of boundaries that intersect with each other, and
   wherein the operable area is formed in a region where the boundaries intersect with each other.

3. The operation device according to claim 1, wherein the dividing portion further comprises a slope with a height gradually decreasing at an end portion thereof on a side of the operable area.

4. An operation device, comprising:
   a detecting portion that is configured to detect an operation by a detected object and comprises a plurality of operational areas each having a different assigned function executable on a controlled device as an operational object;
   a plurality of dividing portions to guide the operation of the detected object and to separate the plurality of operational areas along boundaries between the plurality of operational areas of the detecting portion; and
   a non-dividing portion between adjacent ones of the dividing portions,
   wherein the non-dividing portion comprises a texture different from the dividing portions so as to allow an operation across adjacent ones of the operational areas by the detected object,
   wherein the dividing portions comprise a convex shape protruding from the operational areas, and
   wherein the non-dividing portion further comprises a planar shape substantially flush with the operational areas.

5. The operation device according to claim 4,
   wherein the detecting portion comprises a plurality of boundaries that intersect with each other, and
   wherein the non-dividing portion is formed in a region where the boundaries intersect with each other.

6. The operation device according to claim 4,
   wherein the dividing portions comprise a convex shape protruding from the plurality of operational areas, and
   wherein the non-dividing portion further comprises a linear convex shape lower than the dividing portions.

7. The operation device according to claim 4,
   wherein the dividing portions comprise a concave shape depressed from a surface of the operational areas, and
   wherein the non-dividing portion further comprises a planar shape substantially flush with the operational areas.

8. The operation device according to claim 4,
   wherein the dividing portions comprise a concave shape depressed from a surface of the operational areas, and
   wherein the non-dividing portion further comprises a linear and concave shape shallower or narrower than the dividing portions.

9. The operation device according to claim 1, wherein the raised portion comprises a height that inhibits movement of the detected object.

10. The operation device according to claim 4, wherein the convex shape comprises a height that inhibits movement of the detected object.

* * * * *